United States Patent [19]
Aihara

[11] Patent Number: 5,532,646
[45] Date of Patent: Jul. 2, 1996

[54] HIGH FREQUENCY POWER AMPLIFIER

[75] Inventor: Yukichi Aihara, Kawasaki, Japan

[73] Assignee: Matsushita Electric Industrial Co., Ltd., Osaka, Japan

[21] Appl. No.: 339,698

[22] Filed: Nov. 14, 1994

[30] Foreign Application Priority Data

Nov. 30, 1993 [JP] Japan .................. 5-299778

[51] Int. Cl.⁶ .................................. H03G 3/30
[52] U.S. Cl. .................. 330/279; 330/136; 330/285; 330/296; 455/127
[58] Field of Search ................... 330/129, 136, 330/279, 285, 296; 455/127

[56] References Cited

U.S. PATENT DOCUMENTS

| | | | |
|---|---|---|---|
| 4,268,797 | 5/1981 | Buck et al. | 330/296 X |
| 4,317,083 | 2/1982 | Boyd | 330/296 |
| 4,462,004 | 7/1984 | Cox et al. | 330/296 X |
| 5,087,893 | 2/1992 | Petersen et al. | 330/136 X |
| 5,363,058 | 1/1994 | Sasaki | 330/279 X |

FOREIGN PATENT DOCUMENTS

| | | | |
|---|---|---|---|
| 149108 | 6/1990 | Japan | 330/136 |
| 249810 | 1/1991 | Japan | 330/279 |
| 34611 | 2/1991 | Japan | 330/285 |
| 222524 | 10/1991 | Japan | 455/127 |

Primary Examiner—James B. Mullins
Attorney, Agent, or Firm—Watson Cole; Stevens Davis

[57] ABSTRACT

In a high frequency power amplifier reduction of current consumption at the time of power down and an improvement in distortion of linearly modulated wave at the time of generation of its maximum output are automatically effected at the same time. Part of the high frequency output of a pre-stage amplifier is derived by a directional coupler inserted in the input part of a post-stage amplifier to be superposed through a DC voltage generator circuit on a gate bias voltage applied to the gate terminal of an FET in the post-stage amplifier, so that the gate bias voltage can be automatically controlled to its optimum value according to the output level required for the power amplifier.

20 Claims, 5 Drawing Sheets

HIGH FREQUENCY POWER AMPLIFIER

BACKGROUND OF THE INVENTION

This invention relates to a high frequency power amplifier for use in a mobile radio communication terminal or the like required to operate with high efficiency.

In the field of mobile radio communication, systems utilizing the method of digital modulation are now increasingly put to practical use. In such a system, linear amplification is required in view of the method of modulation, and a power amplifier used in the system is not an exception.

FIG. 1 shows the structure of a conventional two-stage power amplifier commonly used in the field of mobile radio communication. The two-stage power amplifier shown in FIG. 1 consists of power amplifying FET's 1 and 2, and matching circuits 3, 4 and 5. FIG. 2 is a graph showing operating characteristics of such a power amplifier using a GaAs MESFET as its device. In FIG. 2 in which the horizontal axis represents an input to the power amplifier, and the vertical axis represents an output from the power amplifier, the curve A shows how the output changes relative to the input, the curve B shows current consumption of the power amplifier, and the curve C shows how adjacent channel interference power that is an important factor set forth in the Radio Transmitter Standards changes. The power amplifier is demanded to sufficiently satisfy the requisite of the adjacent channel interference power C set forth in the Standards when the power amplifier generates its required maximum output, and the design and selection of the device are further required so as to minimize the power consumption when the values of adjacent channel interference power are up to the Standards.

However, in the case of the conventional power amplifier described above, it is necessary to supply a sufficient amount of idling current in order to decrease modulation distortion that may occur when the power amplifier generates its required maximum output. This is because, as will be seen from the operation characteristics shown in FIG. 2, the current consumption B would not decrease even when the output A decreases, that is, in other words, the power conversion efficiency is very low.

In a digital cellular radio telephone system, transmission power changes over a wide range depending on the command from the base station or the received signal strength. Especially, in the case of the CDMA system, the transmitter output range is as large as 85 dB, and the effective power consumption during speech is substantially dependent on the current consumption at the time of power down. Therefore, how to reduce the current consumption by simple means at the time of power down is a great problem in the system of the kind described above.

SUMMARY OF THE INVENTION

With a view to solve such a prior art problem, it is an object of the present invention to provide a high-frequency power amplifier of multi-stage structure in which the current consumption at the time of power down can be greatly reduced by provision of simple means.

In an embodiment of the high frequency power amplifier of multistage structure according to the present invention which attains the above object, the power level at the pre-stage amplifier is detected, and the result of power level detection is applied to the gate terminal of the last-stage amplifier so as to change the gate voltage of the last-stage amplifier according to the detected high frequency power input level. These operations are automatically done inside the power amplifier unit without requiring any especial external control.

Therefore, according to the present invention, when the high frequency power input level decreases, the bias voltage biasing the last-stage amplifier is deepened in the minus direction thereby decreasing the current consumption, while when the high frequency power input level increases, the input is detected and converted into a DC voltage which is added to the bias voltage to shallow the bias voltage thereby increasing the drain current. As a result, the linearity of the output can be improved so as to reduce the adjacent channel interference power at the time of generation of the required maximum output, so that the current consumption at the time of power down can be greatly reduced without impairing the operation characteristics of the power amplifier at the time of generation of the required maximum output.

DESCRIPTION OF THE PREFERRED EMBODIMENTS

Figure 3:
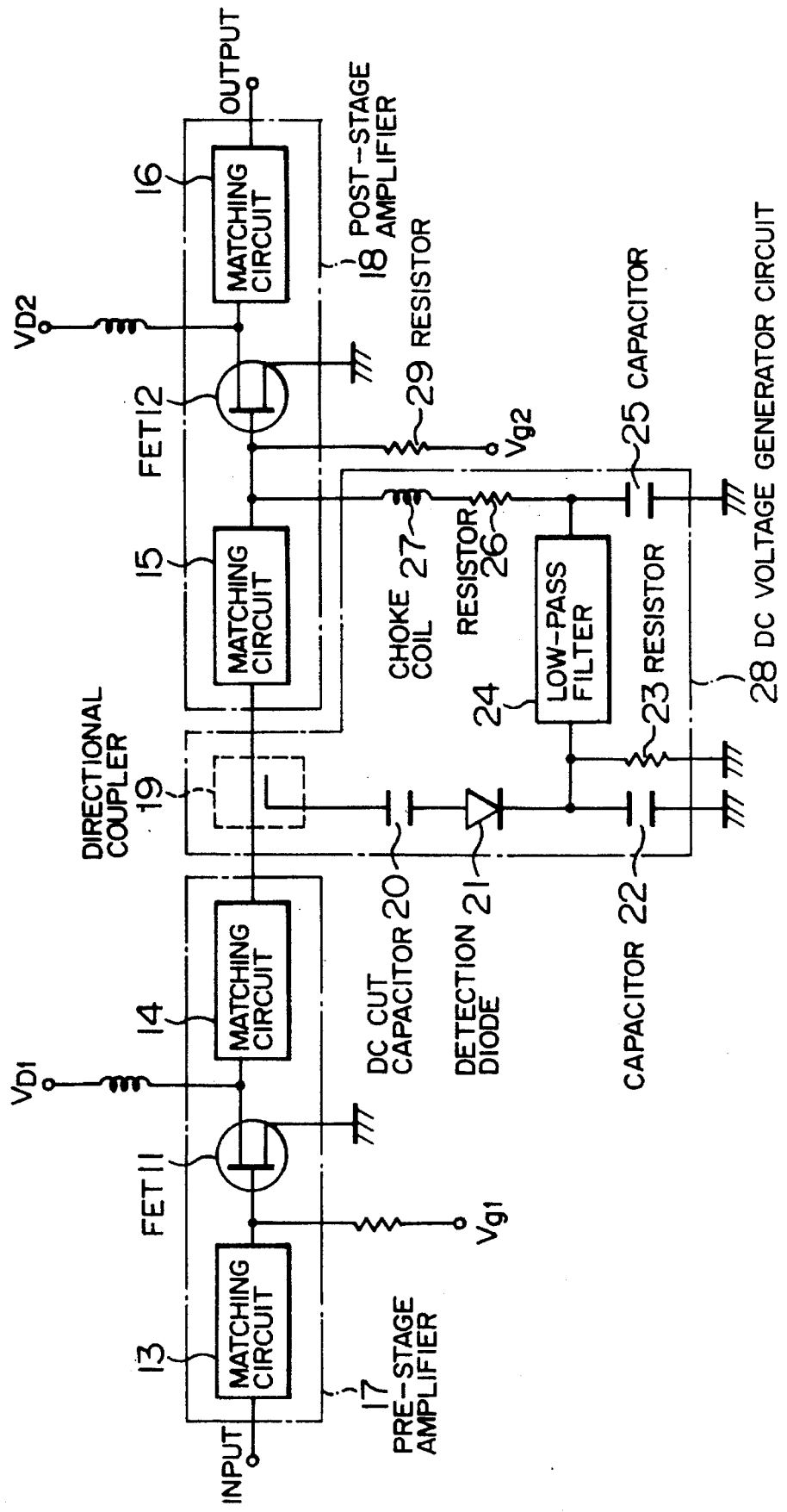
FIG. 3 is a circuit diagram showing the structure of a first embodiment of the high frequency power amplifier according to the present invention.

FIG. 3 is a circuit diagram showing the structure of a first embodiment of the high frequency power amplifier according to the present invention. Referring to FIG. 3, a power amplifying FET 11 and matching circuits 13, 14 constitute a pre-stage amplifier 17, and a power amplifying FET 12 and matching circuits 15, 16 constitute a post-stage amplifier 18, so that these amplifiers 17 and 18 form a two-stage cascade power amplifier. A directional coupler 19 inserted in the input part of the post-stage amplifier 18, a DC cut capacitor 20, a detection diode 21, a capacitor 22, a resistor 23, a lowpass filter 24, a capacitor 25, a resistor 26, and a high frequency decoupling choke coil 27 constitute a DC voltage generator circuit 28. The DC voltage generator circuit 28 is connected at its output to the gate terminal of the power amplifying FET 12 in the post-stage amplifier 18. The matching circuit 13 in the pre-stage amplifier 17 is connected at its output to a DC power source Vg1. The power amplifying FET 12 in the post-stage amplifier 18 is connected at its input to another DC power source Vg2 through a resistor 29.

The operation of the first embodiment of the high frequency power amplifier according to the present invention will now be described. First, the operation of the power amplifying FET 12 in the post-stage amplifier 18 is specifically noted so as to clarify the relation between the gate bias voltage and the operation characteristics of the power amplifier.

Figure 1:
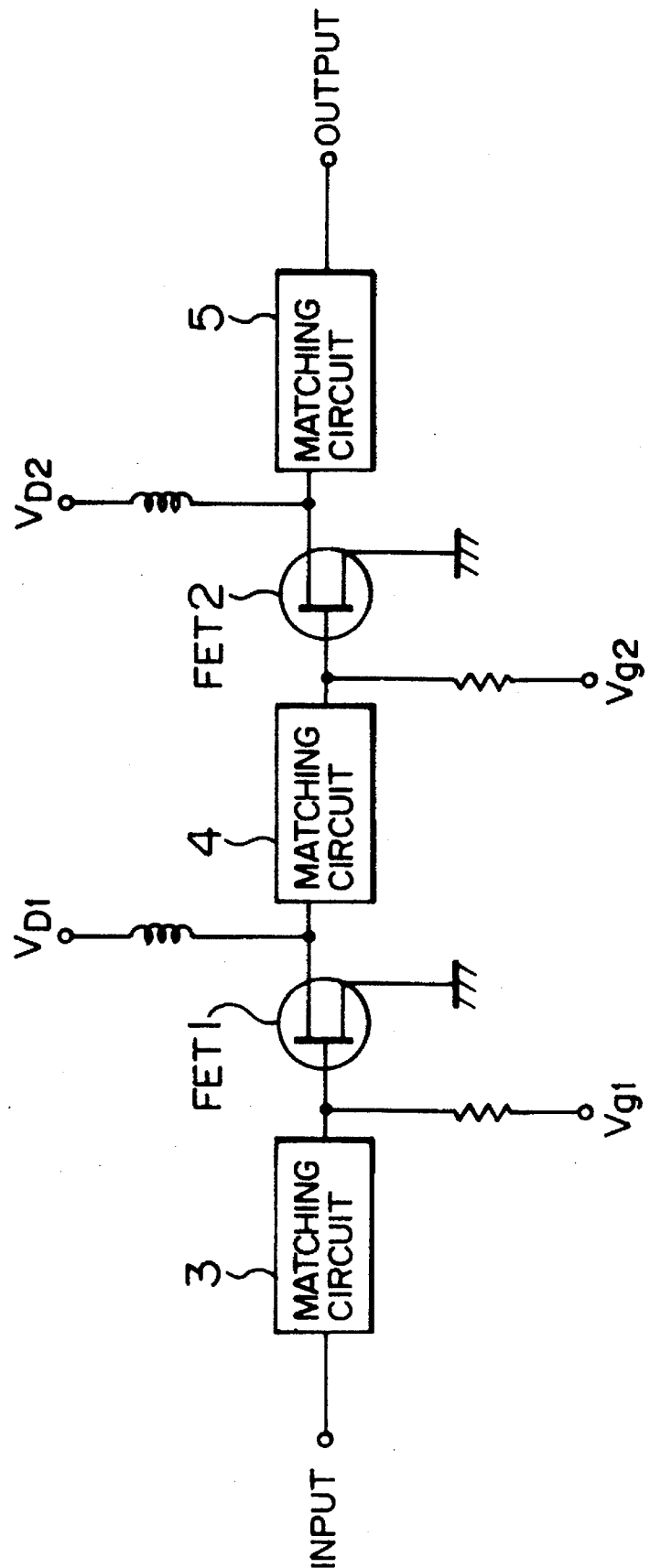
FIG. 1 is a circuit diagram showing the structure of a prior art cascade power amplifier.
Figure 2:
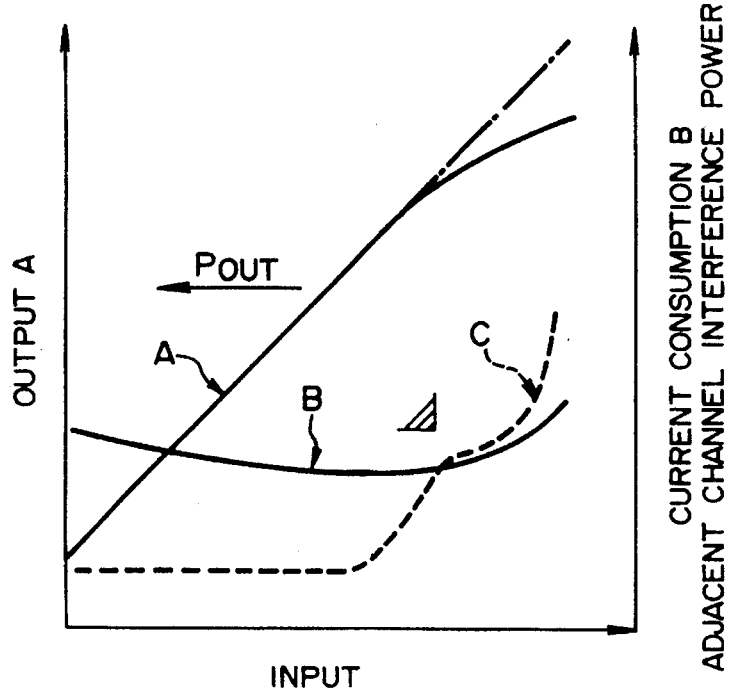
FIG. 2 is a graph showing various characteristics of the prior art power amplifier.
Figure 4:
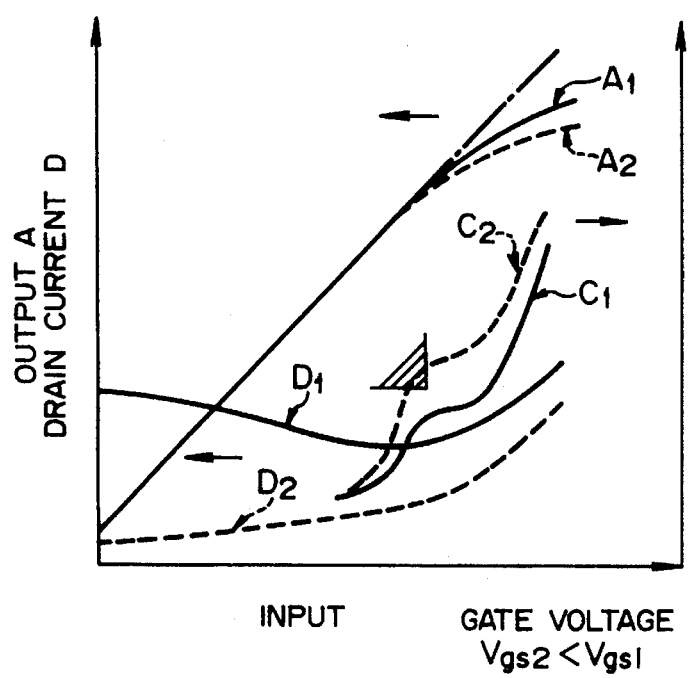
FIG. 4 is a graph showing the result of comparison of the operation characteristics when the gate voltage applied to the power amplifier is changed.

FIG. 4 is a graph showing the result of measurement made to detect how the output A, the drain current D and the adjacent channel interference power C change relative to the input when the gate bias voltage applied to the power amplifying FET 12 is changed. The solid curves show the result of measurement when the gate voltage Vgs1 is high (Vgs2<Vgs1), and it will be seen that the drain current D is large. The broken curves show the result of measurement when the gate voltage Vgs2 is low, and it will be seen that the drain current D is small when the output A is low. In this latter case, the saturation output is low, and the adjacent channel interference power C at about the maximum output of the power amplifier is deteriorated to a value that does not satisfy the Standards.

In the overall current consumption of the power amplifier consisting of the pre-stage amplifier 17 and the post-stage amplifier 18 connected in cascade, the drain current of the power amplifying FET 12 in the post-stage amplifier 18 occupies a predominantly large proportion. Therefore, when the gate bias voltage applied to the power amplifying FET 12 in the post-stage amplifier 18 is changed to be optimum for the high frequency power input level, the desired power conversion high efficiency and the desired minimized modulation distortion at the time of generation of the maximum output can be made compatible with each other.

Figure 5:
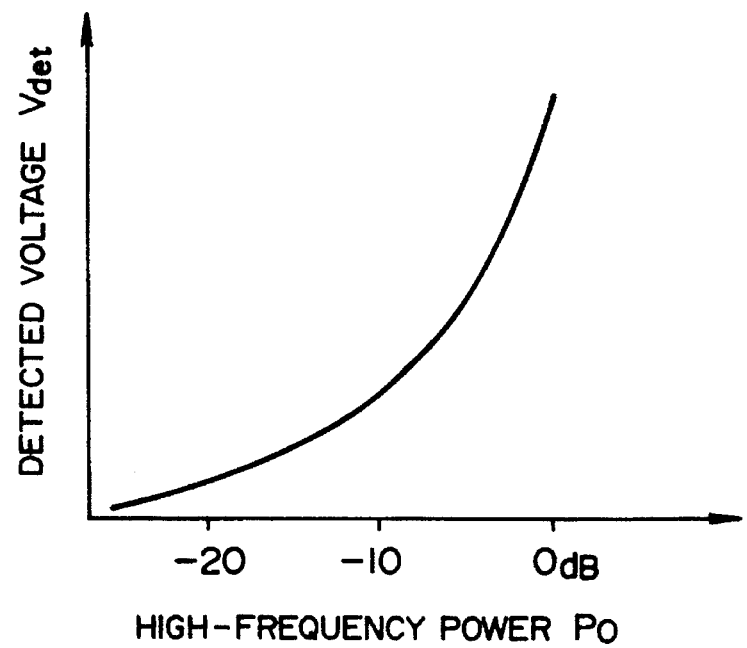
FIG. 5 is a graph showing the relation between the high frequency power and the detected voltage.

In the aforementioned embodiment, a part of the input to the power amplifying FET 12 in the post-stage amplifier 18 is derived by the directional coupler 19 to be converted into the DC voltage by the combination of the DC cut capacitor 20, the detection diode 21, the capacitor 22 and the resistor 23, and, after removing high-speed varying components by the lowpass filter 24, the resultant mean power signal is applied to the gate terminal of the power amplifying FET 12 in the post-stage amplifier 18. FIG. 5 shows the relation between the high frequency power Po and the detected voltage Vdet when the detection diode 21 is used. It will be seen in FIG. 5 that the detected voltage Vdet changes greatly in the range of from the maximum power level to the level where the power Po is lower by 10 dB than the maximum power level, but, when the level of the high frequency power Po becomes lower than the above range, the level of the detected voltage Vdet itself is low and does not appreciably change. Therefore, in the range where the level of the high frequency power Po is lower by 10 dB than the maximum power level, the detected voltage Vdet obtained by detecting the high frequency input power does not appreciably contribute to the generation of the gate voltage, and the gate voltage applied to the power amplifying FET 12 in the post-stage amplifier 18 is provided by dividing the power supply voltage of the DC power source Vg2 by the resistors 23, 26 and 29 and is selected to have a value that will sufficiently restrict the drain current D.

Then, when the high frequency power input increases to increase the output of the power amplifier, the voltage supplied to the resistor 23 increases to increase the voltage applied to the gate terminal of the power amplifying FET 12 in the post-stage amplifier 18. Because the gate voltage increases with the increase in the high frequency power input, the drain current D increases, and, at about the maximum output of the power amplifier, reaches the operation bias point where the adjacent channel interference power C becomes sufficiently satisfactory.

It will thus be seen that, according to the aforementioned embodiment, the power level of the input to the pre-stage amplifier 17 is detected, and the result of level detection is applied to the gate terminal of the power amplifying FET 12 in the post-stage amplifier 18, so that the gate bias voltage biasing the power amplifying FET 12 in the post-stage amplifier 18 is changed to its optimum value conforming to the required output power. Therefore, the requirement for improving the power conversion efficiency when the output of the power amplifier is low can be attained, while the requirement for improving the deterioration of the output due to distortion of the linearly modulated wave when the output of the power amplifier is high can also be attained, and these requirements can be made compatible with each other. Further, because the power amplifier embodying the present invention does not require any external control system, its reliability is high in spite of its simple structure.

Figure 6:
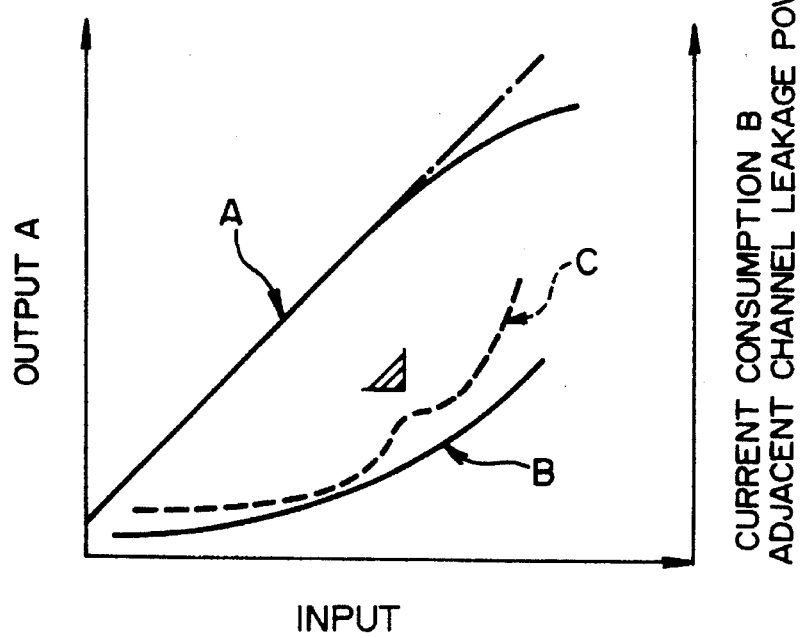
FIG. 6 is a graph showing the operation characteristics of the .first embodiment of the high frequency power amplifier according to the present invention.

FIG. 6 is a graph showing the operation characteristics of the first embodiment of the power amplifier according to the present invention.

In the aforementioned embodiment, the directional coupler 19 is provided at the input part of the post-stage amplifier 18. However, the directional coupler may be replaced by a hybrid divider or a resistance type divider.

It is noted that in the embodiments as described above, the lowpass filter may be formed with CR type or LC type circuit, and with an operational amplifier.

Figure 7:
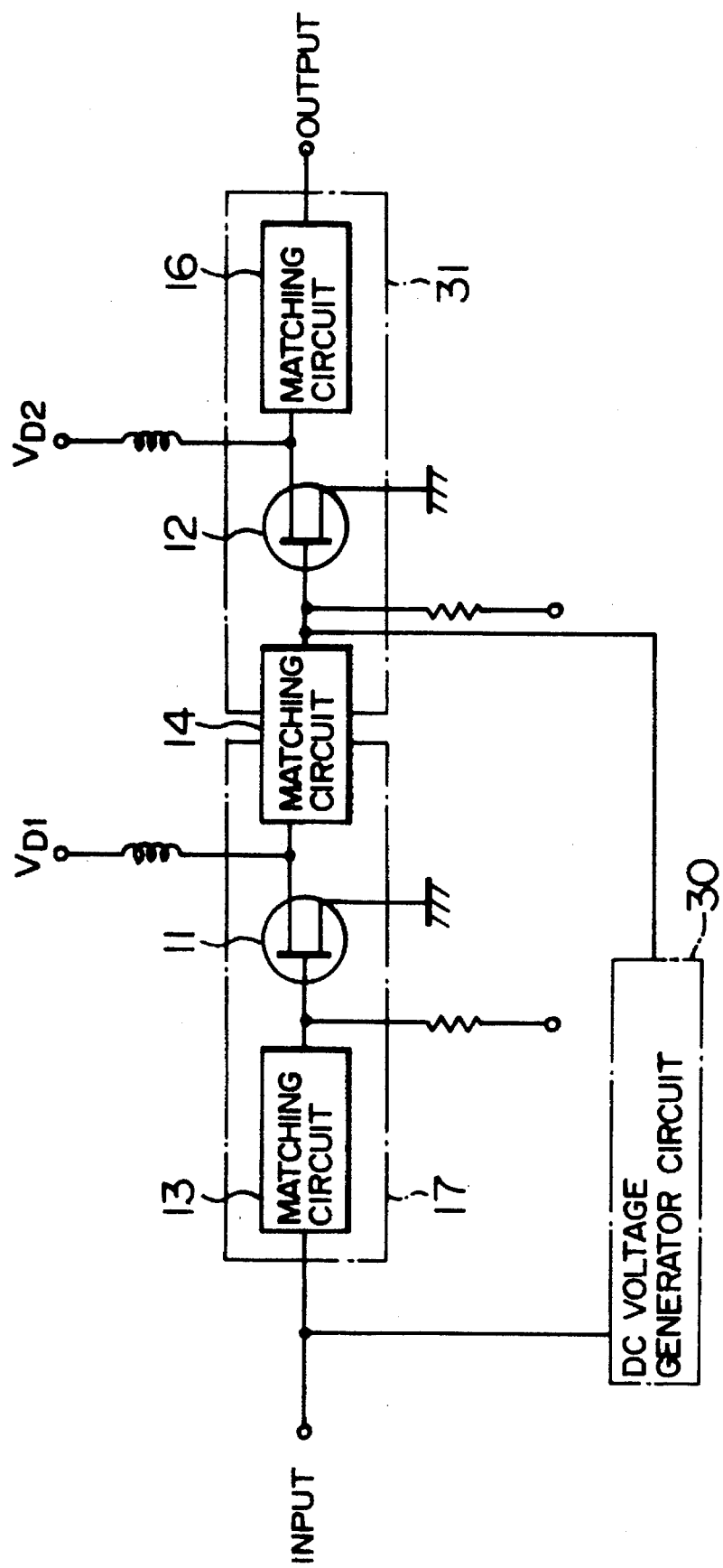
FIG. 7 is a circuit diagram showing the structure of a second embodiment of the high frequency power amplifier according to the present invention.

FIG. 7 is a circuit diagram showing the structure of a second embodiment of the power amplifier according to the present invention. Referring to FIG. 7 showing a partial modification of the first embodiment shown in FIG. 3, a DC voltage generator circuit 30 is disposed at the input part of the pre-stage amplifier 17, and the generated DC voltage is applied to the gate terminal of the power amplifying FET 12 in a last-stage amplifier 31.

I claim:

1. A high frequency power amplifier comprising a plurality of amplifiers connected in cascade, each of said amplifiers including an amplifying element, and first DC voltage generator means including means for detecting an input power level to one of said plurality of amplifiers and means for generating and applying a DC voltage having a level corresponding to said input power level to an input terminal of said amplifying element of said one of said plurality of amplifiers, said first DC voltage generator means including an input coupler means for extracting a part of an input signal to said one of said plurality of amplifiers and means for converting said part of said input signal extracted by said input coupler means to said DC voltage applied to said one of said plurality of amplifiers.

2. A high frequency power amplifier according to claim 1, further comprising second DC voltage generator means for generating and applying a DC voltage to said input terminal of said amplifying element of said one of said plurality of amplifiers simultaneously with said DC voltage applied by said first DC voltage generator means.

3. A high frequency power amplifier according to claim 2, wherein said DC voltage generated by said second DC voltage generator means is constant and said DC voltage generated by said first DC voltage generator means is variable in accordance with said input power level and is superimposed on said constant DC voltage and applied to said input terminal of said amplifying element of said one of said plurality of amplifiers.

4. A high frequency power amplifier according to claim 1, wherein said first DC voltage generator means changes its output DC voltage in an analog mode in accordance with changes in said input power level.

5. A high frequency power amplifier according to claim 1, wherein said first DC voltage generator means detects said input power level at an output side of a first-stage amplifier of said plurality of amplifiers.

6. A high frequency power amplifier according to claim 1, wherein said first DC voltage generator means detects said input power level at an input side of a first-stage amplifier of said plurality of amplifiers.

7. A high frequency power amplifier according to claim 1, wherein said first DC voltage generator further comprises a lowpass filter connected between said means for converting and said one of said plurality of amplifiers.

8. A high frequency power amplifier according to claim 1, wherein said means for converting includes a diode.

9. A high frequency power amplifier comprising a plurality of amplifiers connected in cascade, each of said amplifiers including an amplifying element; first DC voltage generator means including means for detecting an input power level to said plurality of amplifiers and means for generating and applying a DC voltage having a level corresponding to said input power level to an input terminal of said amplifying element of one of said plurality of amplifiers; and second DC voltage generator means for generating and applying a DC voltage to said input terminal of said amplifying element of said one of said plurality of amplifiers simultaneously with said DC voltage applied by said first DC voltage generator means, wherein said first DC voltage generator means includes an input coupler, a DC cut capacitor, a detector circuit, a lowpass filter, a resistor and a coil and is provided at an input part of said amplifying element of said one of said plurality of amplifiers, and said one of said plurality of amplifiers is the last-stage amplifier of said plurality of amplifiers.

10. A high frequency power amplifier according to claim 9, wherein said input coupler is a directional coupler.

11. A high frequency power amplifier according to claim 10, wherein said amplifying element is an FET, and said input terminal is a gate terminal.

12. A high frequency power amplifier according to claim 9, wherein said input coupler interconnects the first-stage amplifier and a later-stage amplifier of said plurality of amplifiers and said first DC voltage generator means detects said input power level by detecting a component of a signal which passes through said input coupler.

13. A high frequency power amplifier according to claim 12, wherein said component of said signal is a radio frequency component.

14. A high frequency power amplifier according to claim 9, wherein an output of said detector circuit represents said input power level and is applied to said lowpass filter and an output of said lowpass filter is provided to said amplifying element of said one of said plurality of amplifiers.

15. A high frequency power amplifier according to claim 9, wherein said detector is a detection diode.

16. A high frequency power amplifier according to claim 9, wherein said input coupler is a hybrid divider.

17. A high frequency power amplifier according to claim 16, wherein said amplifying element is an FET, and said input terminal is a gate terminal.

18. A high frequency power amplifier according to claim 9, wherein said input coupler is a resistance-type divider.

19. A high frequency power amplifier according to claim 18, wherein said amplifying element is an FET, and said input terminal is a gate terminal.

20. A high frequency power amplifier comprising a plurality of amplifiers connected in cascade, each of said amplifiers including an amplifying element, and first DC voltage generator means including means for detecting an input power level of an input signal to a first stage amplifier of said plurality of amplifiers and means for generating and applying a DC voltage having a level corresponding to said input power level to an input terminal of said amplifying element of a later stage amplifier of said plurality of amplifiers, said first DC voltage generator means including an input coupler means for extracting part of said input signal to said first stage amplifier of said plurality of amplifiers and means for converting said part of said input signal extracted by said input coupler means to said DC voltage applied to said later stage amplifier of said plurality of amplifiers.

* * * * *